(12) United States Patent
Tsuchihashi et al.

(10) Patent No.: US 11,251,728 B2
(45) Date of Patent: Feb. 15, 2022

(54) DRIVING CIRCUIT AND DRIVING METHOD OF STEPPING MOTOR AND ELECTRONIC MACHINE USING THE SAME

(71) Applicant: ROHM CO., LTD., Kyoto (JP)

(72) Inventors: Masanori Tsuchihashi, Kyoto (JP); Mitsuo Okada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 46 days.

(21) Appl. No.: 16/815,645

(22) Filed: Mar. 11, 2020

(65) Prior Publication Data
US 2020/0295683 A1 Sep. 17, 2020

(30) Foreign Application Priority Data

Mar. 14, 2019 (JP) .............................. JP2019-046805

(51) Int. Cl.
*H02P 8/12* (2006.01)
*H02P 8/36* (2006.01)
(Continued)

(52) U.S. Cl.
CPC ................ *H02P 8/12* (2013.01); *H02P 6/085* (2013.01); *H02P 6/182* (2013.01); *H02P 8/36* (2013.01); *H03K 5/24* (2013.01)

(58) Field of Classification Search
CPC ................ H02P 8/12; H02P 8/36; H02P 6/085
(Continued)

(56) References Cited

U.S. PATENT DOCUMENTS 7,391,174 B2    6/2008  Son
7,609,015 B2 *  10/2009 Okui ........................ H02P 7/28
                                                      318/400.17
(Continued)

FOREIGN PATENT DOCUMENTS

JP    H09103096 A    4/1997
JP    2000184798 A   6/2000
(Continued)

OTHER PUBLICATIONS

USPTO Non-Final Office Action for corresponding U.S. Appl. No. 16/798,641 dated, Jun. 1, 2021.
(Continued)

*Primary Examiner* — David Luo
(74) *Attorney, Agent, or Firm* — Cantor Colburn LLP

(57) ABSTRACT

A back electromagnetic force detection circuit detects a counter EMF generated in a coil of a stepping motor. A revolution count detection circuit generates a revolution count detection signal. A determining circuit generates a determination signal that is asserted if the revolution count detection signal is stable across multiple consecutive cycles. A current value setting circuit generates a current setting value indicating a target value of a coil current. The current value setting circuit sets the current setting value to a predetermined value in a period in which the determination signal is negated, and adjusts the current setting value according to the counter EMF in a period in which the determination signal is asserted. A constant current chopper circuit generates a pulse modulation signal that modulates by way of having a detection value of a coil current approach close to a target value of the current setting value.

10 Claims, 11 Drawing Sheets

(51) Int. Cl.
*H02P 6/08* (2016.01)
*H03K 5/24* (2006.01)
*H02P 6/182* (2016.01)

(58) Field of Classification Search
USPC .................................................. 318/34, 696
See application file for complete search history.

(56) References Cited

U.S. PATENT DOCUMENTS

| | | | | |
|---|---|---|---|---|
| 8,598,824 | B2* | 12/2013 | Ito | H02P 7/285 |
| | | | | 318/434 |
| 8,659,259 | B2 | 2/2014 | Suda | |
| 2009/0206788 | A1 | 8/2009 | Ando | |
| 2015/0123591 | A1 | 5/2015 | Inoue | |
| 2015/0214878 | A1 | 7/2015 | Takada et al. | |
| 2016/0231139 | A1 | 8/2016 | Mizutani | |
| 2020/0083827 | A1 | 3/2020 | Yamazaki et al. | |
| 2020/0287492 | A1 | 9/2020 | Sega | |

FOREIGN PATENT DOCUMENTS

| | | |
|---|---|---|
| JP | 2004120957 A | 4/2004 |
| JP | 2004180354 A | 6/2004 |
| JP | 2015091215 A | 5/2015 |

OTHER PUBLICATIONS

USPTO Non-Final Office Action for corresponding U.S. Appl. No. 16/798,812 dated, Jun. 7, 2021.

* cited by examiner

DRIVING CIRCUIT AND DRIVING METHOD OF STEPPING MOTOR AND ELECTRONIC MACHINE USING THE SAME

CROSS REFERENCE TO RELATED APPLICATIONS

The present invention claims priority under 35 U.S.C. § 119 to Japanese Application No. 2019-046805 filed Mar. 14, 2019, the entire content of which is incorporated herein by reference.

BACKGROUND OF THE INVENTION

Field of the Invention

The present invention relates to a driving technology for a stepping motor.

Description of the Prior Art

Stepping motors are extensively applied in electronic machines, industrial machinery, and robots. Stepping motors are synchronous motors that rotate synchronously with an input clock generated by a host controller, and have excellent control properties in starting, stopping and positioning. Thus, stepping motors feature capabilities for positioning control in an open loop and suitability for digital signal processing.

FIG. 1 shows a block diagram of a conventional stepping motor and a motor system of a driving circuit thereof. A host controller 2 supplies an input clock CLK to a driving circuit 4. The driving circuit 4 changes the excitation position in synchronization with the input clock CLK.

FIG. 2 shows a diagram illustrating excitation positions. The excitation position is regarded as a combination of coil currents (driving currents) $I_{OUT1}$ and $I_{OUT2}$ flowing through two coils L1 and L2 of a stepping motor 6. In FIG. 2, eight excitation positions 1 to 8 are depicted. In 1-phase excitation, current alternately flows in the first coil L1 and the second coil L2, thus changing the excitation position to 2, 4, 6 and 8. In 2-phase excitation, current flows in the first coil L1 and the second coil L2, thus changing the excitation position to 1, 3, 5 and 7. 1-2-phase excitation is a combination of 1-phase excitation and 2-phase excitation, and causes the excitation position to change among 1 and 8. In micro-step driving, the excitation position is even more finely controlled.

FIG. 3 shows a diagram of a driving sequence of a stepping motor. At startup, the frequency $f_{IN}$ of the input clock CLK rises along with time, and the stepping motor accelerates. Once the frequency $f_{IN}$ is kept constant upon reaching a predetermined target value, the stepping motor rotates at a constant speed. To stop the stepping motor, the frequency of the input clock CLK is reduced to decelerate the stepping motor. The control in FIG. 3 is also referred to as trapezoidal wave drive.

In a normal state, a rotor of a stepping motor rotates synchronously in a unit of a step angle directly proportional to the number of input clocks. However, if a drastic change in the load or speed occurs, deviation from said synchronization is produced and such is referred to as "out-of-step". Once out-of-step happens, special processing needs to be performed in order to drive the stepping motor normally. Thus, avoiding out-of-step is desired.

Hence, during acceleration and deceleration having higher probabilities of out-of-step, a target value $I_{REF}$ of a driving current is set to a constant value $I_{FULL}$ (high-torque mode), so as to obtain an output torque large enough without causing out-of-step with respect to speed change.

In a situation where the revolution count is stable and the probability of out-of-step is lower, efficiency (high-efficiency mode) is improved by reducing the target value $I_{REF}$ of the driving current. Patent document 5 proposes a technique as follows—the technique on one hand avoids out-of-step, and on the other hand optimizes an output torque (i.e., a current amount) by means of feedback, hence reducing power consumption and improving efficiency. More specifically, a load angle $\phi$ is estimated according to a counter electromotive force (EMF) $V_{BEMF}$, and the target value $I_{REF}$ of the driving currents (coil currents) $I_{OUT1}$ and $I_{OUT2}$ are controlled by way having the load angle $\phi$ approach close to a target value $\phi_{REF}$. The counter EMF $V_{BEMF}$ is represented by equation (1):

$$V_{BEFM} = KE \times \omega \cos\phi \qquad (1)$$

In equation (1), $\omega$ is the angular speed (to be referred to as the revolution count or frequency) of the stepping motor, and KE is a counter EMF constant.

PRIOR ART DOCUMENTS

Patent Publication

[Patent document 1] Japan Patent Publication No. JPH09103096

[Patent document 2] Japan Patent Publication No. JP2004-120957

[Patent document 3] Japan Patent Publication No. JP2000-184789

[Patent document 4] Japan Patent Publication No. JP2004-180354

[Patent document 5] Japan Patent Publication No. JP6258004

SUMMARY OF THE INVENTION

Problems to be Solved by the Invention

The applicants conducted research on the control in FIG. 3 and arrived at the following issues. Under the control in FIG. 3, a high-efficiency mode is fixedly selected during a period in which the frequency of the input clock CLK is kept constant. However, in a situation where there is a change in the load or a change in the revolution count during the process of the selected high-efficiency mode, out-of-step can be present due to an insufficient torque. The reason for such is that, due to the limitation in the response speed of a feedback loop, delay before reaching the target current $I_{REF}$ capable of maintaining the load angle $\phi$ cannot be overlooked.

The present invention is accomplished in view of this issue. One object of an exemplary embodiment of the present invention is to provide a driving circuit capable of switching to a high-torque mode and a high-efficiency mode.

Technical Means for Solving the Problem

A driving circuit for a stepping motor is provided according to an implementation form of the present invention. The driving circuit includes: a counter electromotive force (EMF) detection circuit, detecting a counter EMF generated in a coil of the stepping motor; a revolution count detection circuit, generating a revolution count detection signal indicating the revolution count of the stepping motor; a determining circuit, generating a determination signal that is asserted if the revolution count detection signal is stable across multiple consecutive cycles; a current value setting circuit, generating a current setting value indicating a target value of a coil current flowing into the coil, setting the current setting value to a predetermined value during a period in which the determination signal is negated, and adjusting the current setting value according to the counter EMF during a period in which the determination signal is asserted; a constant current chopper circuit, generating a pulse modulation signal that pulse-width modulates by way of having a detection value of the coil current approach close to a target value based on the current setting value; and a logic circuit, controlling a bridge circuit connected to the coil according to the pulse modulation signal.

According to the implementation form, while the revolution count is monitored, a high-efficiency mode is selected under a condition that the revolution count is stable, and switching to a high-torque mode is performed when the revolution count is unstable, hence suppressing out-of-step as well as improving efficiency.

The determining circuit can include a memory storing revolution count detection signals of multiple consecutive cycles. Among the multiple revolution count detection signals stored in the memory, if errors of all adjacent pairs are less than a first threshold value and an error between the first revolution count detection signal and the last revolution count signal is less than a second threshold value, the determination signal is asserted.

The revolution count detection signal can also be an input clock inputted to the driving circuit, or is based on a period of an internal signal of the driving circuit.

The current value setting circuit can include: a load angle estimating portion, estimating a load angle according to the counter EMF; and a feedback controller, generating the current setting value by way of having the estimated load angle approach close to a predetermined target angle.

The constant current chopper circuit can also include: a comparator, comparing the detection value of the coil current with a threshold value of the current setting value; an oscillator, performing oscillation according to a predetermined frequency; and a flip-flop, outputting the pulse modulation signal that transitions to an off level according to an output of the comparator and transitions to an on level according to an output of the oscillator.

The driving circuit can be integrated on a semiconductor substrate. The term "integrated" includes a situation where all constituent elements of the circuit are formed on the semiconductor substrate and a situation where main constituent elements of the circuit are formed on the semiconductor substrate; alternatively, a part of resistors or capacitors can be provided outside the semiconductor substrate so as to adjust circuit constants. By integrating the circuit in one chip, circuit area can be reduced while preserving balanced characteristics of electrical elements.

Further, any combination of the constituent elements above, and any invention derived from mutual substitutions made to the constituent elements of the invention and methods, devices and systems presented therefrom are also considered as effective embodiments of the present invention.

Effects of the Invention

According to an embodiment of the present invention, a high-torque mode and a high-efficiency mode can be appropriately switched.

DETAILED DESCRIPTION OF THE EMBODIMENTS

Figure 1:
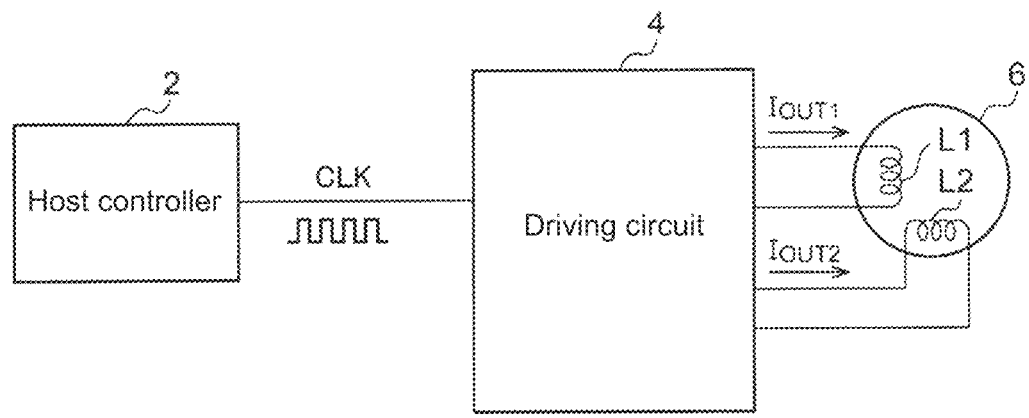
FIG. 1 is a block diagram of a conventional stepping motor and a motor system of a driving circuit thereof.

Details of the present invention are given in preferred embodiments with the accompanying drawings below. The same or equivalent constituent elements, components, or processes depicted in the drawings are represented by the same denotations, and repeated description is appropriately omitted. Further, the embodiments are examples that do not form limitations to the present invention. All features stated in the embodiments and any combination thereof are not necessarily essential features of the present invention.

In the description, "a state of component A being connected to component B" includes, in addition to a situation where component A and component B are directly physically connected, a situation where component A and component B are indirectly connected to other components, in a way that no substantial influences are produced on the electrical connection state thereof or no damage on functions and effects produced thereby in combination is resulted.

Similarly, "a state of component C being arranged between component A and component B" includes, in addition to a situation where component A and component C or component B and component C are directly connected, a situation where said components are connected to other components, in a way that no substantial influences are produced on the electrical connection state thereof or no damage on functions and effects produced thereby in combination is resulted.

For better understanding, the vertical and horizontal axes of waveform diagrams and timing diagrams referred in the description are appropriately scaled up or scaled down.

Further, the waveforms depicted are simplified, exaggerated or emphasized for better understanding.

Embodiments

Figure 4:
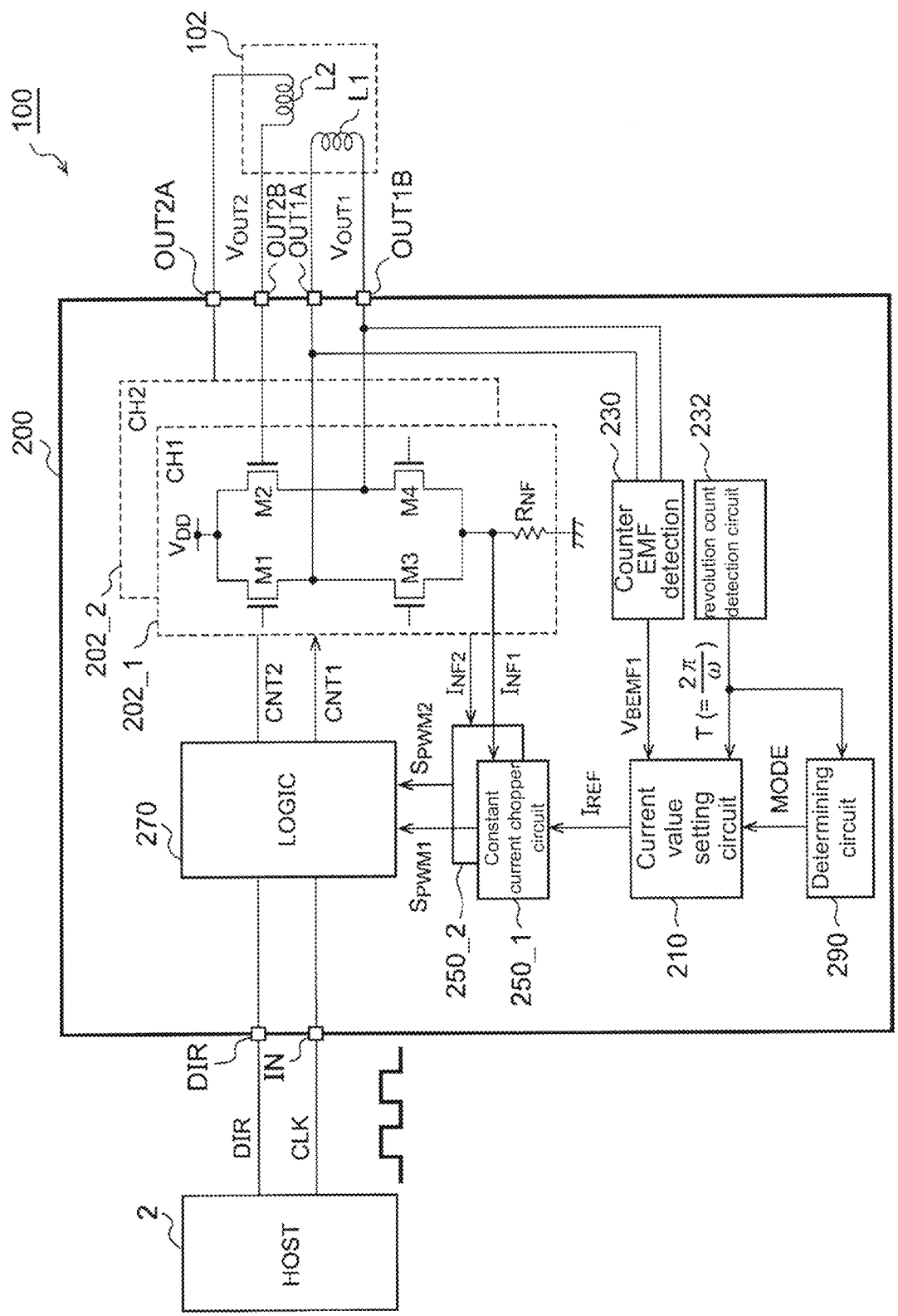
FIG. 4 is a block diagram of a motor system of a driver system according to an embodiment.

FIG. 4 shows a block diagram of a motor system 100 of a driving circuit 200 according to an embodiment. The driving circuit 200, a stepping motor 102 and a host controller 2 jointly form the motor system 100. The stepping motor 102 can be any of a permanent magnet (PM) type, a variable reluctance (VR) type, and a hybrid type.

An input pin IN of the driving circuit 200 is inputted from the host controller 2 to the input clock CLK. Further, a direction indication signal DIR indicating a clockwise (CW) direction or a counterclockwise (CCW) direction is inputted to a direction indication pin DIR of the driving circuit 200.

Each time when the driving circuit 200 is inputted to the input clock CLK, a rotor of the stepping motor 102 rotates toward a direction corresponding to the direction indication signal DIR by a predetermined angle.

The driving circuit 200 includes bridge circuits 202_1 and 202_2, a current value setting circuit 210, a counter electromotive force (EMF) detection circuit 230, a revolution count detection circuit 232, constant current chopper circuits 250_1 and 250_2, a logic circuit 270 and a determining circuit 290, which are integrated on one semiconductor substrate.

In this embodiment, the stepping motor 102 is a 2-phase motor, and includes a first coil L1 and a second coil L2. The driving method of the driving circuit 200 is not specifically defined, and can be any one of 1-phase excitation, 2-phase excitation, 1-2-phase excitation, and micro-stepping motor (W1-2-phase driving or 2W1-2-phase driving).

The bridge circuit 202_1 of a first channel CH1 is connected to the first coil L1. The bridge circuit 202_2 of a second channel CH2 is connected to the second coil L2.

Each of the bridge circuits 202_1 and 202_2 is an H bridge circuit that includes four transistors M1 to M4. The transistors M1 to M4 of the bridge circuit 202_1 are switched according to a control signal CNT1 from the logic circuit 270, accordingly switching the voltage (also referred to as a first coil voltage) $V_{OUT1}$ of the first coil L1.

The bridge circuit 202_2 is identically structured as the bridge circuit 202_1. the transistors M1 to M4 thereof are switched according to a control signal CNT2 from the logic circuit 270, accordingly switching the voltage (also referred to as a second coil voltage) $V_{OUT2}$ of the second coil L2.

The current value setting circuit 210 generates a current setting value $I_{REF}$. Shortly after the startup of the stepping motor 102, the current value $I_{REF}$ is set to a predetermined value (referred to as a maximum torque setting value) $I_{FULL}$. The predetermined value $I_{FULL}$ can also be set as a maximum value of a configurable current range. In this case, the stepping motor 102 is driven by using maximum torque—such state is referred to as a high-torque mode.

Once the stepping motor 102 starts rotating stably, in other words, once the possibility of out-of-step is reduced, the stepping motor 102 transitions to a high-efficiency mode. The current value setting circuit 210 adjusts the current setting value $I_{REF}$ by means of feedback control in the high-efficiency mode, hence reducing power consumption.

Figure 2:
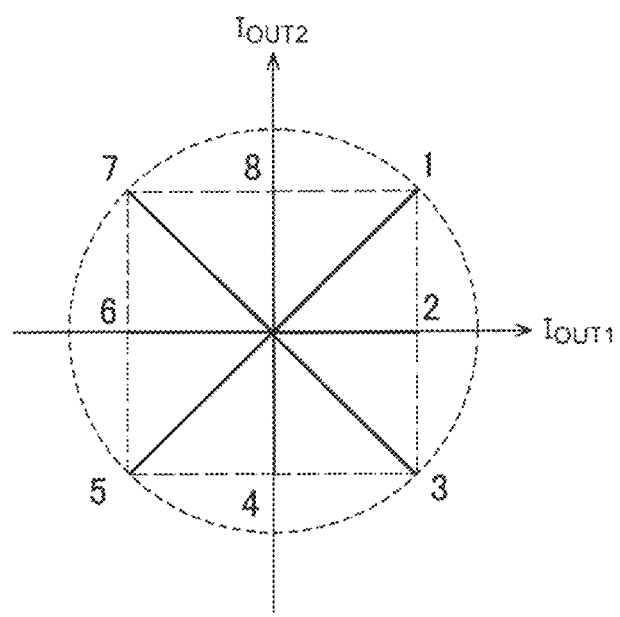
FIG. 2 is a diagram illustrating excitation positions.
Figure 3:
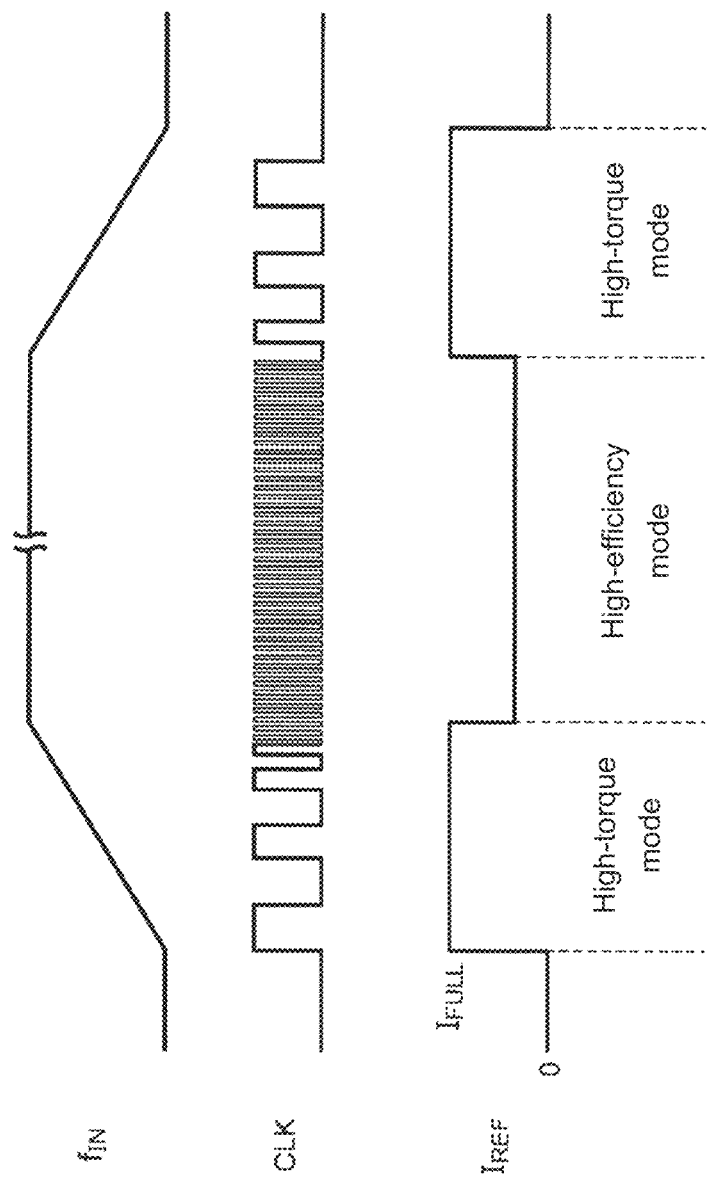
FIG. 3 is a diagram illustrating a driving sequence of a stepping motor.

The counter EMF detection circuit 230 detects a counter EMF $V_{BEFM1}$ ($V_{BEMF2}$) generated in the coil L1 (L2) of the stepping motor 102. The method for detecting the counter EMF is not specifically limited, and can be implemented by commonly known techniques. In general, the counter EMF can be obtained by the following method: setting a detection window (detection interval), setting two ends of the coil as high impedance, and sampling the voltage of the coil at this point, thus obtaining the counter EMF. For example, in 1-phase excitation or 1-2-phase excitation, the counter EMF $V_{BEMF1}$ ($V_{BEMF2}$) can be measured at each excitation position (2, 4, 6 and 8 in FIG. 2) in high impedance, i.e., each predetermined excitation position, on one end (the output of the bridge circuit) of the coil serving as a monitoring object.

A revolution count detection circuit 232 obtains the revolution count ω (to be referred to as the revolution count ω) of the stepping motor 102, and generates a detection signal representing the revolution count ω. For example, the revolution count detection circuit 232 can detect a period T (=2π/ω) directly proportional to the reciprocal of the revolution count ω, and output the period T as the detection signal. In a situation free from out-of-step, the frequency (period) of the input clock CLK is directly proportional to the revolution count (period) of the stepping motor 102. Thus, the revolution count detection circuit 232 can also set the detection signal by detecting the input clock CLK, or on the basis of the period of an internal signal generated thereby.

The constant current chopper circuit 250_1 generates a pulse modulation signal $S_{PWM1}$ while electricity passes through the first coil L1, wherein the pulse modulation signal $S_{PWM1}$ pulse-width modulates by way of having a detection value $I_{NF1}$ of a coil current $I_{L1}$ flowing through the first coil L1 approach close to a target value based on the current setting value $I_{REF}$. The constant current chopper circuit 250_2 generates a pulse modulation signal $S_{PWM2}$ while electricity passes through the second coil L2, wherein the pulse modulation signal $S_{PWM2}$ pulse-width modulates by way of having a detection value $I_{NF2}$ of a coil current $I_{L2}$ flowing through the second coil L2 approach close to the current setting value $I_{REF}$.

Each of the bridge circuits 202_1 and 202_2 includes a current detection resistor $R_{NF}$, and the voltage of the current detection resistor $R_{NF}$ reduces to become a detection value of the coil current $I_L$. Further, the position of the current detection resistor $R_{NF}$ is not limited, and the current detection resistor $R_{NF}$ can be configured on a power side, or be connected to the coils in series and be configured between two outputs of the bridge circuits.

The logic circuit 270 controls the bridge circuit 202_1 connected to the first coil L1 according to the pulse modulation signal $S_{PWM1}$. Further, the logic circuit 270 controls the bridge circuit 202_2 connected to the second coil L2 according to the pulse modulation signal $S_{PWM2}$.

Each time when the logic circuit 270 is inputted to the input clock CLK, the excitation position is changed and the coil (or coil pair) supplying current is switched. The excitation position is considered as a combination of the values of the respective current currents of the first coil L1 and the second coil L2 and the direction. The excitation position can transition according to a rising edge or a falling edge of the input clock CLK, or can transition according to both said edges thereof.

The current value setting circuit 210 is configured to switch to (i) the high-torque mode in which the current setting value $I_{REF}$ of a predetermined coil current amplitude is fixed to a larger value equivalent to the maximum torque, and (ii) the high-efficiency mode in which the current setting value $I_{REF}$ is adjusted by means of feedback control. The mode of the current value setting circuit 210 is selected according to a determination signal MODE generated by the determining circuit 290. In the high-efficiency mode, the current setting value $I_{REF}$ is generated according to the counter EMF $V_{BEMF1}$.

The determining circuit 290 asserts the determination signal MODE (as high) if the revolution count detection signal generated by the revolution count circuit 232 is stable across multiple continuous cycles, or negates the determination signal MODE (as low) if the revolution count detection signal is unstable.

Figure 5:
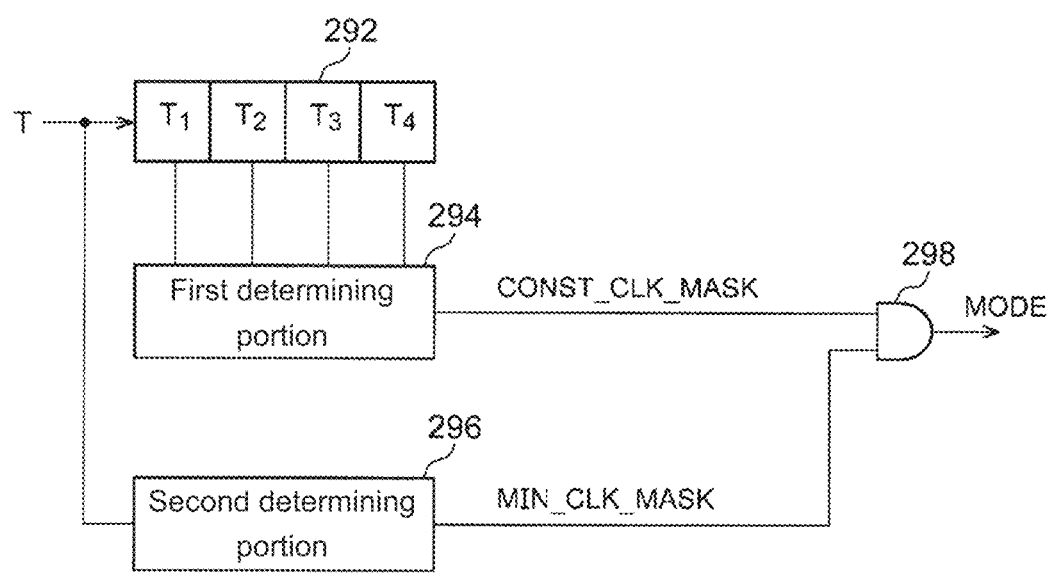
FIG. 5 is a circuit diagram of an exemplary structure of a determining circuit.

FIG. 5 shows a circuit diagram of an exemplary structure of the determining circuit 290. The determining circuit 290 includes a memory 292, a first determining portion 294, a second determining portion 296, and an AND gate 298.

The memory 292 is a first-in-first-out (FIFO) memory, and stores multiple (4 in this example) consecutive revolution count detection signals T.

The first determining portion 294 determines that if the revolution count is stable according to the multiple revolution count detection signals T1 to T4 stored in the memory 292, and asserts a mask signal CONST_CLK_MASK (as high) if the revolution count is stable.

The second determining portion 296 compares the revolution count detection signal T with a threshold value TTH, and if T is less than TTH, in other words, if the revolution count ω is more than a threshold value ωTH, asserts a mask signal MIN_CLK_MASK (as high).

The AND gate 298 determines the logic of the two mask signals CONST_CLK_MASK and MIN_CLK_MASK, and outputs the determination signal MODE. The determination signal MODE is asserted if the revolution count of the stepping motor 102 is stable and if the revolution count is more than a threshold value.

Figure 6:
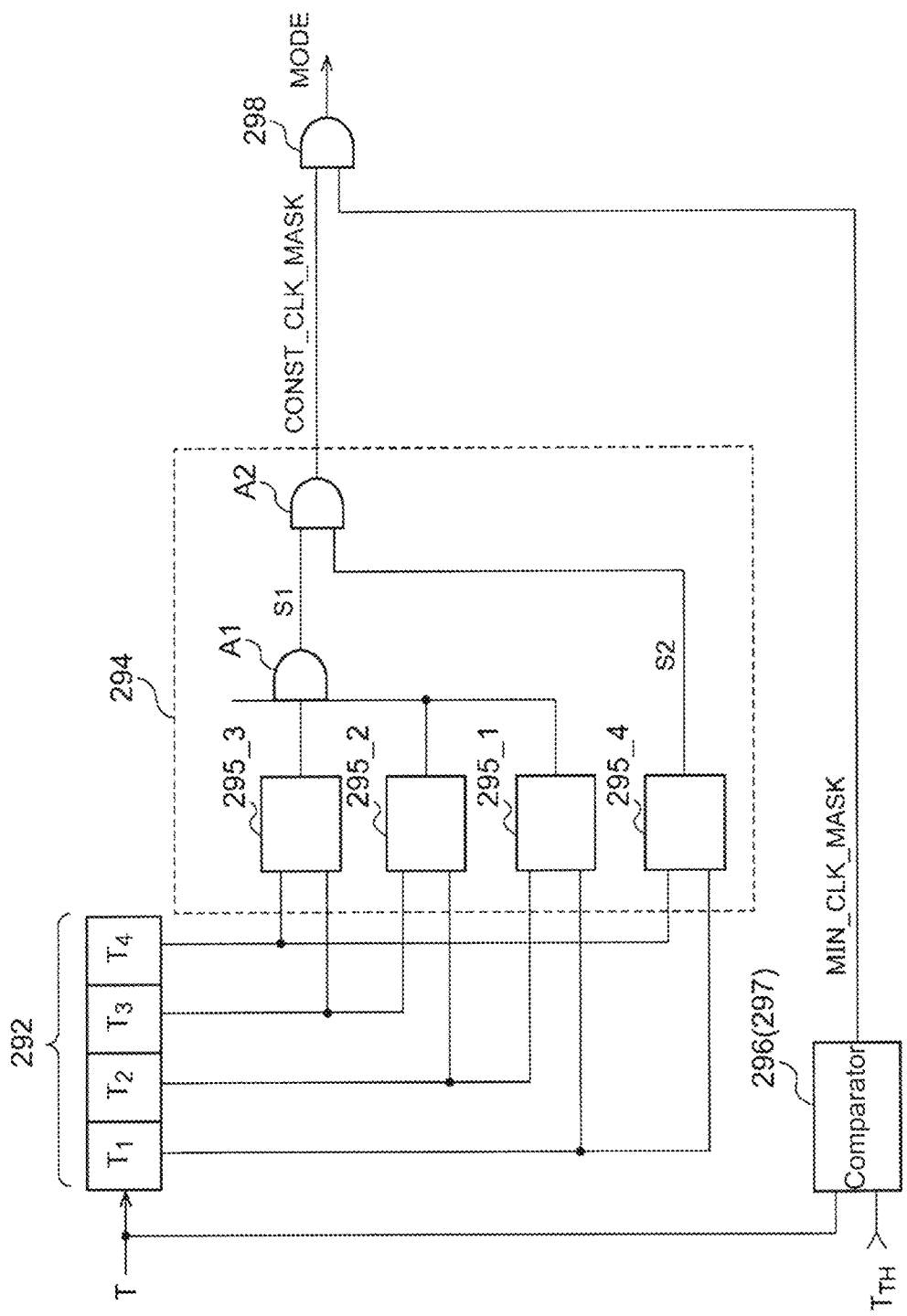
FIG. 6 is a circuit diagram of a specific exemplary structure of a determining circuit.

FIG. 6 shows a circuit diagram of a specific exemplary structure of the determining circuit 290. The first determining portion 294 includes determining logics 295_1 to 295_4, and AND gates A1 and A2.

The first determining portion 294 asserts an intermediate determination signal S1 (as high) if errors of all adjacent pairs among the multiple revolution count detection signals T1 to T4 stored in the memory 292 are less than a first threshold value. The $i^{th}$ determining logic 295_i (where i is 1 to 3) determines whether a difference between an $i^{th}$ revolution count detection signal Ti and an $(i+1)^{th}$ detection signal Ti+1 is more than or less than the first threshold value. The AND gate A1 determines the logic of outputs from the multiple determining logics 295_1 to 295_3, and outputs the intermediate determination signal S1.

The determining logic 295_4 is identically structured as the determining logics 295_1 to 295_3. The determining logic 295_4 asserts an intermediate determination signal S2 if a difference between the first revolution count detection signal T1 and the last revolution count detection signal T4 is less than a second threshold value.

For example, the determining logic 295_i (where i is 1 to 4) can also set an output thereof to high (1) if an error between two outputs is less than 6.25%.

The AND gate A2 determines the logic of the two intermediate determination signals S1 and S2, and outputs the mask signal CONST_CLK_MASK. The mask signal CONST_CLK_MASK becomes asserted (as high) if the frequency of the input clock CLK is stable.

The second determining portion 296 includes a comparator 297, which compares the revolution count detection signal T with the threshold value TTH. The second determining portion 296 asserts the mask signal MIN_CLK_MASK (as high) if T is less than TTH, in other words, if the revolution count ω is more than the threshold value ωTH.

Figure 7:
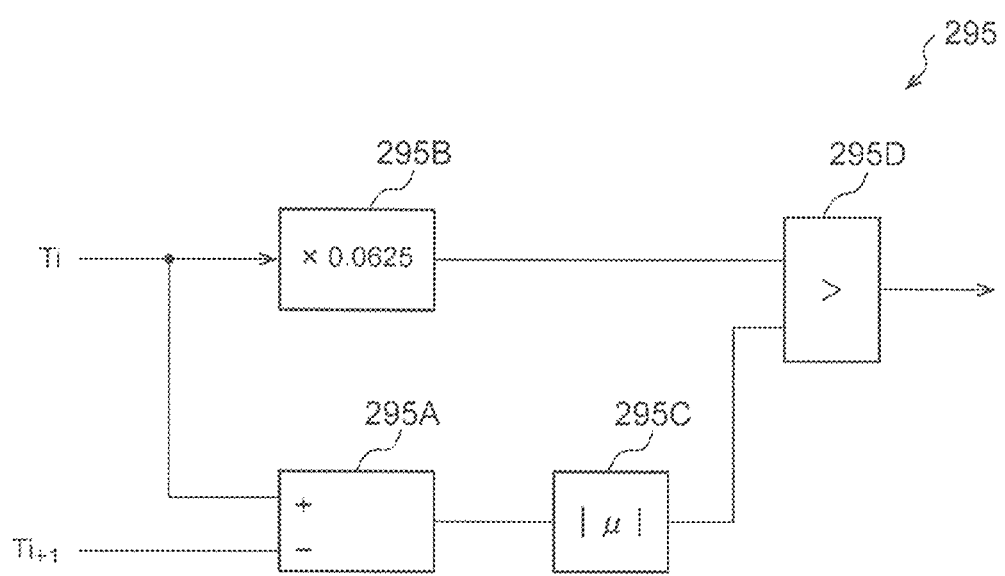
FIG. 7 is a diagram of an exemplary structure of determining logics.

FIG. 7 shows a diagram of an exemplary structure of the determining logic 295_i. The determining logic 295 includes a subtractor 295A, a coefficient circuit 295B, an absolute value circuit 295C, and a comparator 295D. The subtractor 295A generates the difference between two inputs Ti and Ti_1, that is, a change in period. The coefficient circuit 295B multiplies an input Ti by a coefficient corresponding to a tolerance rate. As described above, in a situation where the tolerable rate is 6.25% (=1/16), the coefficient circuit 295B can include a level shifter shifting Ti by 4 bits, and thus the circuit can be simplified.

The absolute value circuit 295C determines an absolute value of an output (i.e., the change in period) of the subtractor 295A. The comparator 295D compares an output of the absolute value circuit 295C with the tolerance rate serving as an output of the coefficient circuit 295B, and outputs a signal indicative of a size relationship.

Figure 8:
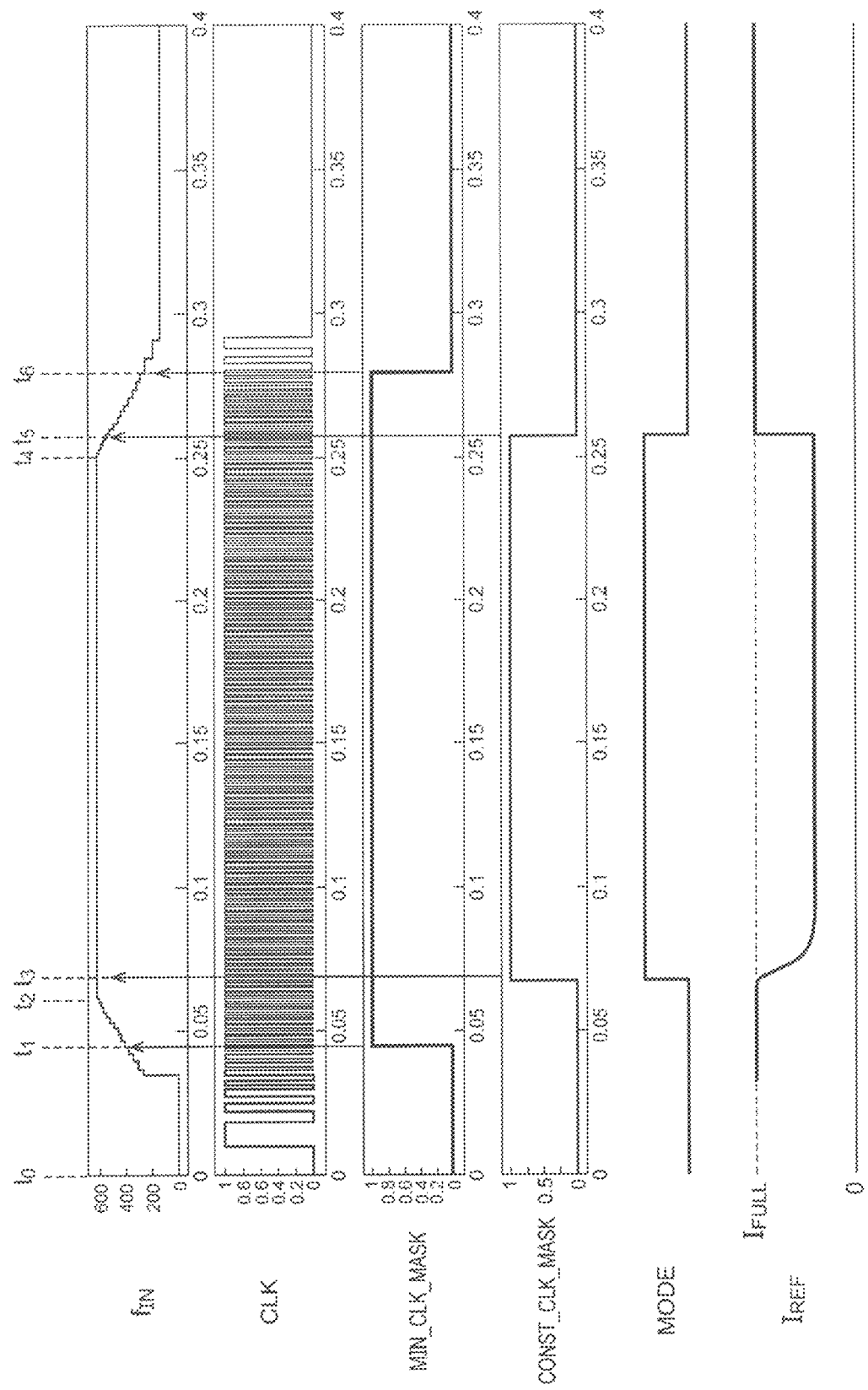
FIG. 8 is a waveform diagram of the operation of the driving circuit in FIG. 4.

The structure of the driving circuit 200 is explained as above, and the operation of the driving circuit 200 is to be described below. FIG. 8 shows a waveform diagram of the operation of the driving circuit 200 in FIG. 4. At a time point $t_0$, the input clock CLK is inputted, and the frequency thereof persistently increases along with time. At this point, the current instruction value $I_{REF}$ is fixed to the high-torque setting value $I_{FULL}$.

Next, at a time point $t_1$, once the frequency $f_{IN}$ of the input clock CLK, in other words, the revolution count of the stepping motor 102, exceeds the threshold value, the mask signal MIN_CLK_MASK is asserted.

After a time point $t_2$, the frequency of the input clock CLK becomes stable. Then, from the time point $t_2$ to a time point $t_3$ four cycles after that, the mask signal CONST_CLK_MASK is asserted, the determination signal MODE becomes high.

Once the determination signal MODE has become high, transition to the high-efficiency mode is performed. In the high-efficiency mode, the current instruction value $I_{REF}$ is optimized according to the counter EMF $V_{BEFM}$.

At a time point $t_4$, the frequency $f_{IN}$ of the clock starts reducing. Next, at a time point $t_5$ four cycles after that, the mask signal CONST_CLK_MASK is negated, and the determination signal MODE becomes low. Once the determination signal MODE has become low, transition to the high-torque mode is performed, and the current instruction value $I_{REF}$ is fixed to the high-torque setting value $I_{FULL}$. At a time point $t_6$, the mask signal MIN_CLK_MASK is negated when the revolution count is less than the threshold value.

Figure 9:
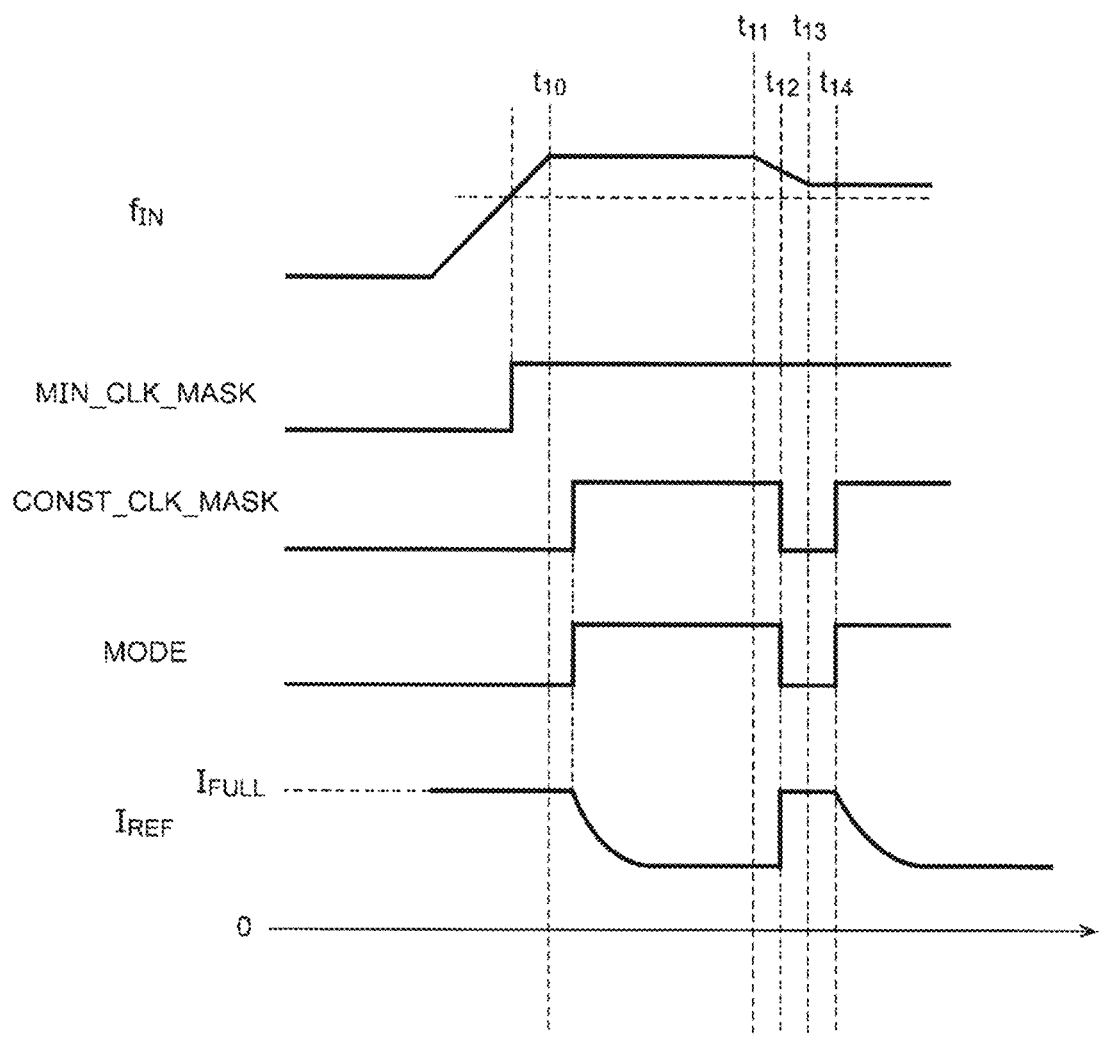
FIG. 9 is a waveform diagram of the operation when the frequency $f_{IN}$ of the input clock CLK changes.

FIG. 9 shows a waveform diagram of the operation when the frequency $f_{IN}$ of the input clock CLK changes. At a time point $t_{10}$, the frequency $f_{IN}$ of the input clock CLK becomes stable. At a time point $t_{11}$, the frequency $f_{IN}$ of the input clock CLK starts reducing, and at a time point $t_{12}$ four cycles after that, the mask signal CONST_CLK_MASK is negated, and the determination signal MODE becomes low. Thus, transition to the high-torque mode is performed, and the stepping motor 102 is driven by the maximum torque. Thus, the revolution count of the stepping motor 102 is reduced along with the frequency $f_{IN}$ of the input clock CLK.

At a time point $t_{13}$, the frequency of the input clock CLK becomes stable. At a time point $t_{14}$, when the mask signal CONST_CLK_MASK is again asserted, the determination signal MODE becomes high. Thus, returning to the high-efficiency mode takes place.

The operation of the driving circuit 200 is described as above. The driving circuit 200 is capable of selecting the high-efficiency mode by monitoring the input clock giving an instruction to the revolution count of the stepping motor and using the stable revolution count as a condition, so as to improve efficiency. In a situation where the revolution count is unstable, the mode can be switched to the high-torque mode so as to suppress out-of-step, thus following the change in frequency of the input clock, that is, the change in the revolution count instruction.

The counter EMF $V_{BEFM}$ is directly proportional to the revolution count. Therefore, in a situation where the revolution count is low, the counter EMF $V_{BEMF}$ is small and cannot be accurately measured. Thus, during a period in which the mask signal MIN_CLK_MASK is generated and negated, the mode is set to the high-torque mode that does not refer to the counter EMF $V_{BEMF}$. Accordingly, when the frequency of the input clock CLK is fixed in a state of a lower value, the stepping motor 102 can be accurately driven.

Figure 10:
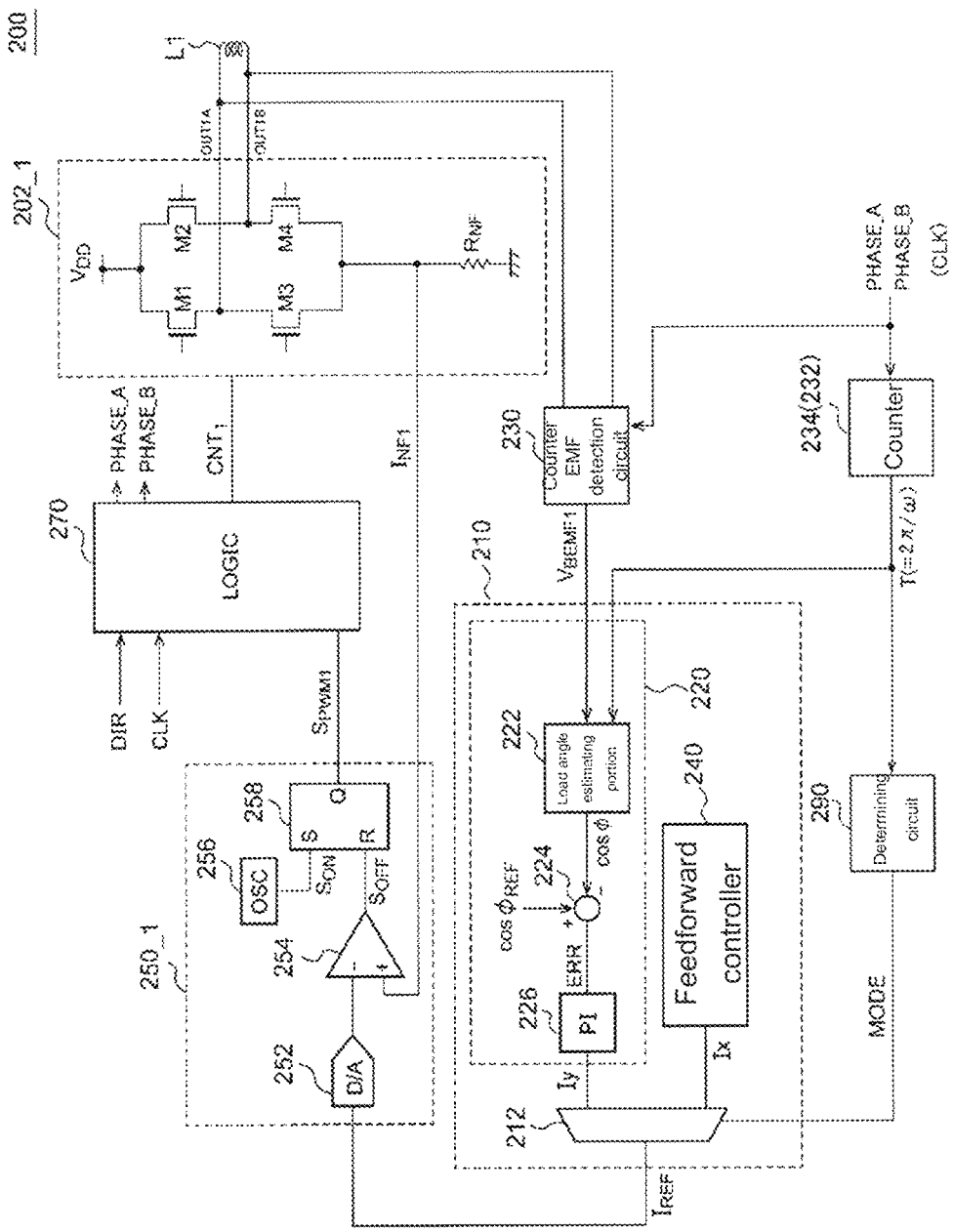
FIG. 10 is a circuit diagram of an exemplary structure of a driving circuit.

FIG. 10 shows a circuit diagram of an exemplary structure of the driving circuit 200. Only parts related to the first coil L1 are depicted in FIG. 10.

The logic circuit 270 changes the excitation position in synchronization with the input clock CLK. In the logic circuit 270, multiple intermediate signals are generated. Among these signals, time signals PHASE_A and PHASE_B can be used as signals indicating a period or time in/at which an output OUT1A becomes high impedance and a period or time in/at which an output OUT1B becomes high impedance.

The counter EMF detection circuit 230 measures the counter EMF in response to the time signals PHASE_A and PHASE_B.

The revolution count detection circuit 232 includes a counter 234. The counter 234 measures at least one period T of the time signals PHASE_A and PHASE_B. The periods T of the time signals PHASE_A and PHASE_B are revolution count detection signals inversely proportional to the revolution count of the stepping motor 102.

The determining circuit 290 monitors the revolution count detection signal, and sets the determination signal MODE to high if the frequency of the input clock CLK is fixed and is more than the threshold value, or sets the determination signal MODE to low if not. The determination signal MODE is supplied to the current value setting circuit 210. The current value setting circuit 210 becomes the high-torque mode if the determination signal MODE is low, or becomes the high-efficiency mode if the determination signal MODE is high.

The current value setting circuit 210 includes a feedback controller 220, a feedforward controller 240, and a multiplexer 212. The feedforward controller 240 outputs a fixed current setting value Ix ($=I_{FULL}$) used in the high-torque mode shortly after the startup.

The feedback controller 220 is active in the high-efficiency mode, and outputs a current setting value Iy of feedback control according to the counter EMF $V_{BEMF}$.

The multiplexer 216 selects one of the two signals Ix and Iy according to the determination signal MODE, and outputs the selected signal as a current setting value $I_{ref}$.

The feedback controller 220 includes a load angle estimating portion 222, a subtractor 224 and a proportional integration (PI) controller 226.

The load angle estimating portion 222 estimates a load angle φ according to the back-EMF $V_{BEMF1}$. The load angle φ is equivalent to a difference between a current vector (i.e., position instruction) specified by the driving current flowing into the first coil L1 and the position of the rotor (mover). As described above, the back-EMF $V_{BEMF1}$ is provided according to the following equation:

$$V_{BEMF1} = K_E \cdot \omega \cdot \cos\phi$$

In the equation above, $K_E$ is the counter EMF constant, and ω is the revolution count. Thus, by measuring the counter EMF $V_{BEMF1}$, a detection value correlated with the load angle φ can be generated. For example, cosφ can be set as the detection value. In this case, the detection value is represented by equation (4):

$$\cos\phi = V_{BEMF1} \cdot \omega^{-1} / K_E \qquad (4)$$
$$= V_{BEMF1} \cdot (T/2\pi) \cdot K_E^{-1}$$

The feedback controller 220 generates the current setting value Iy by way of having the estimated load angle φ approach close to the predetermined target angle $\phi_{REF}$. More specifically, the subtractor 224 generates an error ERR according to the detection value cosφ based on the load angle φ and the target value $\cos(\phi_{REF})$ thereof. The PI controller 226 performs a PI control operation by way for having the error ERR become zero and generates the current setting value Iy. Alternatively, a proportional (P) controller using a P control operation or a proportional integral derivative (PID) performing a PID control operation can be used in substitution for the PI controller. Alternatively, the processing of the feedback controller 220 can also be realized by an analog circuit using an error amplifier.

The constant current chopper circuit 250_1 includes a digital-to-analog converter (DAC) 252, a PWM comparator 254, an oscillator 256, and a flip-flop 258. The DAC 252 converts the current setting value $I_{REF}$ to an analog voltage $V_{REF}$. The PWM comparator 254 compares the feedback signal $I_{NF1}$ with the reference voltage $V_{REF}$, and asserts a turn-off signal $S_{OFF}$ (setting to high) if $I_{NF1}$ is more than $V_{REF}$. The oscillator 256 generates a periodic turn-on signal $S_{ON}$ specifying the chopper frequency. The flip-flop 258 outputs the pulse modulation signal $S_{PMW1}$, which changes to an on level (e.g., high) according to the turn-on signal $S_{ON}$ or changes to an off level (e.g., low) according to the turn-off signal $S_{OFF}$.

Figure 11:
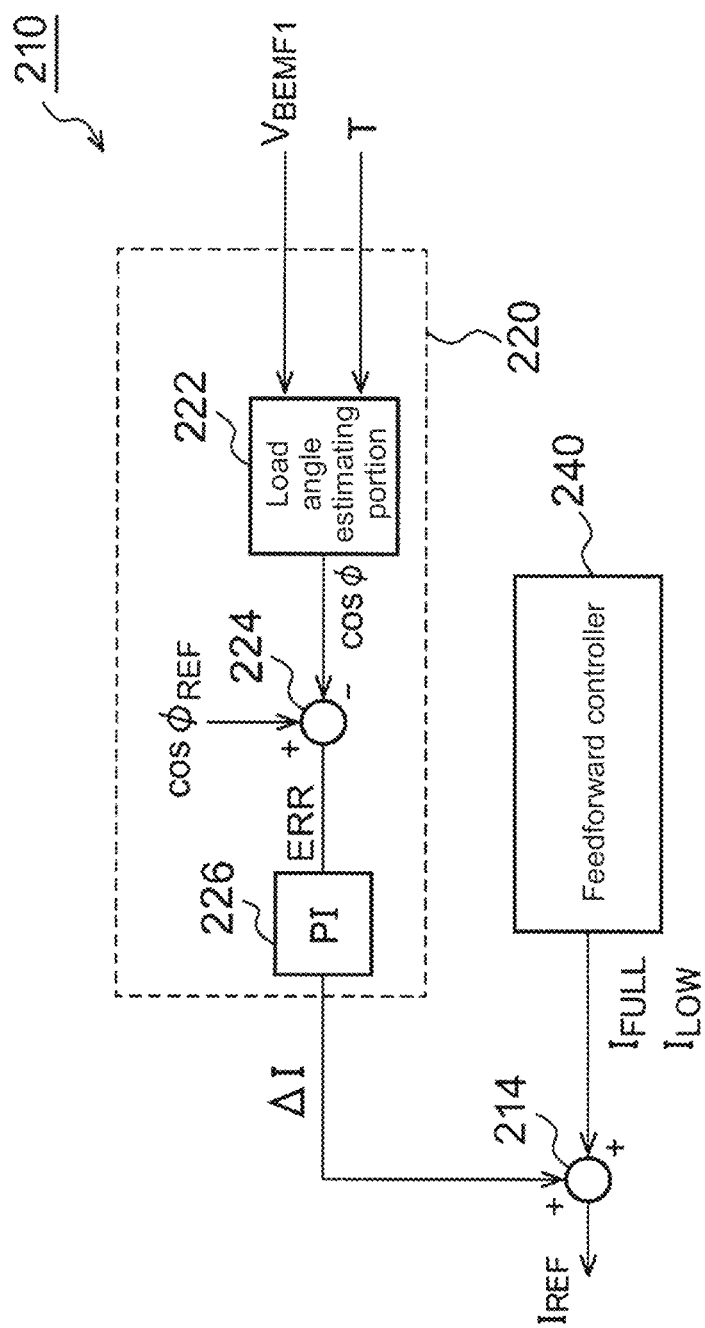
FIG. 11 is a diagram of another exemplary structure of a current value setting circuit.

FIG. 11 shows a diagram of another exemplary structure of the current value setting circuit 210. The feedback controller 220 is active in the high-efficiency mode, and generates a current correction value ΔI of an adjustment value by way of having the load angle φ approach close to the target value $\phi_{REF}$. The current correction value ΔI is zero in the high-torque mode and a parameter measuring mode.

In the high-efficiency mode, the feedforward controller 240 outputs the predetermined high-efficiency setting value $I_{LOW}$. The relationship $I_{FULL} > I_{Low}$ can also be established. The current value setting circuit 210 includes an adder 214 in substitution for the multiplexer 212 in FIG. 10. The adder 214 adds the high-efficiency setting value $I_{LOW}$ generated in the feedforward controller 240 with the current correction value ΔI. Thus, the current setting value $I_{REF}$ is adjusted as $I_{REF} = I_{LOW} + \Delta I$ by way of having the load angle φ approach close to the target value $\phi_{REF}$.

Figure 12A:
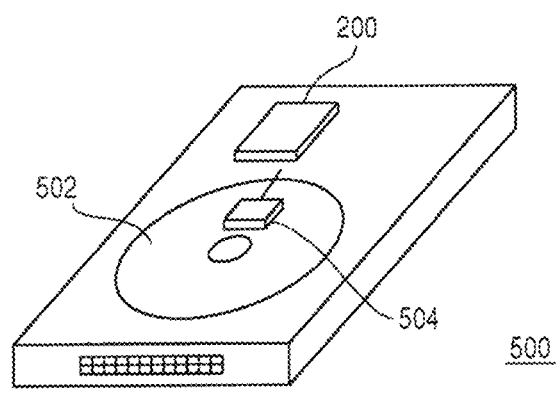
FIGS. 12A to FIG. 12C are three-dimensional diagrams of examples of an ELECTRONIC machine having a driving circuit.
Figure 12B:
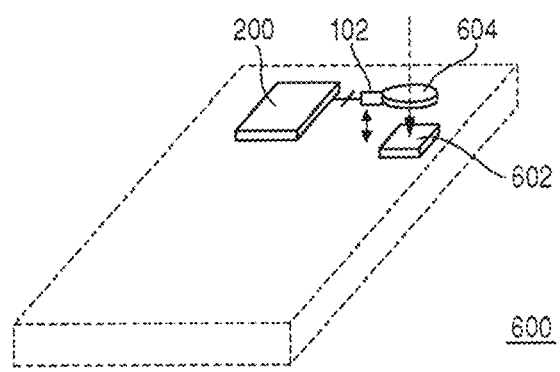
Figure 12C:
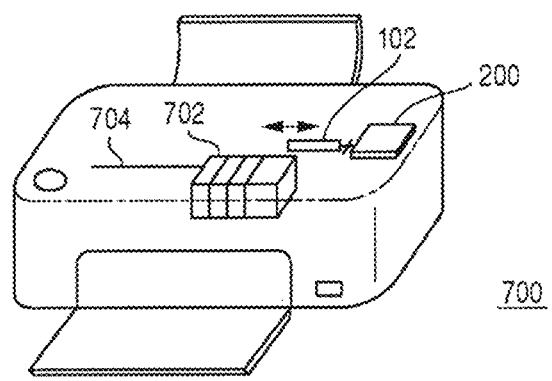

Lastly, the purpose of the driving circuit 200 is described below. The driving circuit 200 is used in various ELECTRONIC machines. FIG. 12A TO FIG. 12C show three-dimensional diagrams of examples of ELECTRONIC machines including the driving circuit 200.

The ELECTRONIC machine in FIG. 12A is an optical disc device 500. The optical disc device 500 includes an optical disc 502 and a reader 504. The reader 504 is provided to write data to and read data from the optical disc 502. The reader 504 is capable of moving (tracking) on a recording surface of the optical disc 502 along a radial direction of the optical disc 502. Further, the distance from the reader 504 to the optical disc is also variable (for focusing). The reader 504 is positioned by a stepping motor not shown in the drawing. The driving circuit 200 controls the stepping motor. This structure is capable of avoiding out-of-step on one hand and efficiently positioning the reader 504 with high precision on the other hand.

The ELECTRONIC machine in FIG. 12B is a device 600 such as a digital static camera, a digital video camera or a cell phone terminal having an image capturing function. The device 600 includes a capturing element 602 and an automatic focusing lens 604. The stepping motor 102 performs positioning of the automatic focusing lens 604. This structure of the driving circuit 200 for driving the stepping motor 102 is capable of avoiding out-of-step on one hand and efficiently positioning the automatic focusing lens 604 with high precision on the other hand. In addition to an automatic focusing lens, the driving circuit 200 can also be used to drive a jitter correction lens. Alternatively, the driving circuit 200 can also be used in aperture control.

The ELECTRONIC machine in FIG. 12C is a printer 700. The printer 700 includes a head 702 and a guiding rail 704. The head 702 is supported and can be positioned along the guiding rail 704. The stepping motor 102 controls the position of the head 702. The driving circuit 200 controls the stepping motor 102. This structure is capable of avoiding out-of-step on one hand and efficiently positioning the head 702 with high precision on the other hand. In addition to being used for driving the head, the driving circuit 200 can also be used to drive a motor for a paper conveyor mechanism.

The present invention is described by way of the embodiments above. The embodiments are examples, and a person skilled in the art should understand that there are numerous variation embodiments from combinations of these constituent elements and processes. Further, such variation embodiments are to be encompassed within the scope of the present invention. Some variation embodiments are described below.

Variation Embodiment 1

The logic circuit 270 can also adjust the power voltage $V_{DD}$ supplied to the bridge circuit 202 in substitution for or in combination with the method of adjusting the current setting value $I_{REF}$ by way of having the load angle $\phi$ approach close to the target angle $\phi_{REF}$. By changing the power voltage $V_{DD}$, the power supplied to the coils L1 and L2 of the stepping motor 102 can be changed.

Variation Embodiment 2

In the embodiments above, a situation where the bridge circuit 202 includes a full-bridge circuit (H bridge) is given as an example; however, the present invention is not limited thereto, and a half-bridge circuit can be included. Further, the bridge circuit 202 and the driving circuit 200 can be different chips, or can be discrete parts.

Variation Embodiment 3

The method for generating the current setting value $I_{REF}$ (Iy) in the high-efficiency mode is not limited to the methods described in the embodiments. For example, the target value $V_{BEMF}$ (REF) of the counter EMF $V_{BEMF1}$ can be determined in advance, and a feedback loop can be formed by way of having the counter EMF $V_{BEMF1}$ approach close to the target value $V_{BEMF}$ (REF).

Variation Embodiment 4

In the embodiments above, the two currents $I_{OUT1}$ and $I_{OUT2}$ flowing through the two coils are connected or disconnected according to the excitation position, but the current amounts thereof are not associated with the excitation position. In this case, the torque changes according to the excitation position. In substitution for the control, the currents $I_{OUT1}$ and $I_{OUT2}$ can also be corrected by a fixed means regardless of how the excitation position changes. For example, in 1-2-phase excitation, the current amounts of the currents $I_{OUT1}$ and $I_{OUT2}$ at the excitation positions 2, 4, 6 and 8 can be set as $\sqrt{2}$ times the current amounts at the excitation positions 1, 3, 5 and 7.

The present invention has been described in terms of the embodiments above. However, these embodiments demonstrate merely principles and applications of the present invention. There are numerous variations embodiments and configuration modifications without departing from the scope of the concept of the present invention, as specified in the appended claims.

What is claimed is:

1. A driving circuit that is a driving circuit of a stepping motor, comprising:
    a counter electromotive force (EMF) detection circuit, detecting a counter EMF generated in a coil of the stepping motor;
    a revolution count detection circuit, generating a revolution count detection signal indicating a revolution count of the stepping motor;
    a determining circuit, generating a determination signal that is indicating the revolution count detection signal is stable across continuous cycles;
    a current value setting circuit, generating a current setting value indicating a target value of a coil current flowing in the coil, setting the current setting value to a predetermined value when the determination signal is negated, and adjusting the current setting value according to the counter EMF when the determination signal is asserted;
    a constant current chopper circuit, generating a pulse modulation signal that pulse-width modulates by way of having the detection value of the coil current approach close to the target value of the current setting value; and
    a logic circuit, controlling a bridge circuit connected to the coil according to the pulse modulation signal.

2. The driving circuit according to claim 1, wherein the determining circuit comprises a memory storing the revolution count detection signal of continuous cycles, and asserts the determination signal when errors of all adjacent pairs of the plurality of revolution count detection signals stored in the memory are less than a first threshold value and error between a first detection signal and a last revolution count detection signal is less than a second threshold value.

3. The driving circuit according to claim 2, wherein the determining circuit asserts the determination signal when the revolution count detection signal is stable across a plurality of cycles and the revolution count is higher than a predetermined threshold value.

4. The driving circuit according to claim 1, wherein the determining circuit asserts the determination signal when the revolution count detection signal is stable across a plurality of cycles and the revolution count is higher than a predetermined threshold value.

5. The driving circuit according to claim 1, wherein the revolution count detection signal is an input clock inputted to the driving circuit or a period of an internal signal based on the input clock.

6. The driving circuit according to claim 1, wherein the current value setting circuit comprises:
 a load angle estimating portion, estimating a load angle according to the counter EMF; and
 a feedback controller, generating the current setting value by having the estimated load angle approach to a predetermined target angle.

7. The driving circuit according to claim 1, wherein the constant current chopper circuit comprises:
 a comparator, comparing the detection value of the coil current with a threshold value based on the current setting value;
 an oscillator, performing oscillation according to a predetermined frequency; and
 a flip-flop, outputting the pulse modulation signal that transitions to an off level according to an output of the comparator and transitions to an on level according to an output of the oscillator.

8. The driving circuit according to claim 1 is integrated on a semiconductor substrate.

9. An ELECTRONIC machine, comprising:
 a stepping motor; and
 the driving circuit according to claim 1 for driving the stepping motor.

10. A driving method that is a driving method of a stepping motor, comprising:
 detecting a counter electromotive force (EMF) generated in a coil of the stepping motor;
 generating a revolution count detection signal indicating the revolution count of the stepping motor;
 generating a determination signal that is asserted when the revolution count detection signal is stable across continuous cycles;
 setting the current setting value to a predetermined value when the determination signal is negated, and adjusting the current setting value according to the counter EMF when the determination signal is asserted;
 generating a pulse modulation signal that pulse modulates the detection value of a coil current flowing in the coil approach to a target value based on the current setting value; and
 controlling a bridge circuit connected to the coil according to the pulse modulation signal.

* * * * *